(12) United States Patent
Buechel et al.

(10) Patent No.: US 8,205,572 B2
(45) Date of Patent: *Jun. 26, 2012

(54) VACUUM TREATMENT INSTALLATION FOR THE PRODUCTION OF A DISK-SHAPED WORKPIECE BASED ON A DIELECTRIC SUBSTRATE

(75) Inventors: Arthur Buechel, Ruggell (LI); Werner Wieland, Malans (CH); Christoph Ellert, Feldkirch (AT)

(73) Assignee: Oerlikon Solar AG, Truebbach, Truebbach (CH)

( * ) Notice: Subject to any disclaimer, the term of this patent is extended or adjusted under 35 U.S.C. 154(b) by 404 days.

This patent is subject to a terminal disclaimer.

(21) Appl. No.: 12/235,845

(22) Filed: Sep. 23, 2008

(65) Prior Publication Data

US 2009/0025632 A1    Jan. 29, 2009

Related U.S. Application Data

(62) Division of application No. 10/835,708, filed on Apr. 30, 2004, now Pat. No. 7,449,220.

(51) Int. Cl.
*C23C 16/00* (2006.01)
*C23F 1/00* (2006.01)
*H01L 21/306* (2006.01)

(52) U.S. Cl. ................ 118/723 E; 156/345.43
(58) Field of Classification Search .............. 118/715, 118/722, 723 R, 723 E; 156/345.43, 345.44, 156/345.45, 345.46, 345.47; 315/111.21
See application file for complete search history.

(56) References Cited

U.S. PATENT DOCUMENTS

| | | | |
|---|---|---|---|
| 5,885,356 A * | 3/1999 | Zhao et al. | 118/723 ER |
| 6,228,438 B1 * | 5/2001 | Schmitt | 427/569 |
| 6,631,692 B1 | 10/2003 | Matsuki et al. | |
| 7,661,388 B2 * | 2/2010 | Schmitt | 118/723 E |
| 2001/0010207 A1 * | 8/2001 | Yamamoto et al. | 118/723 MW |
| 2001/0052322 A1 * | 12/2001 | Hirayama et al. | 118/723 MW |
| 2003/0089314 A1 | 5/2003 | Matsuki | |
| 2005/0133160 A1 * | 6/2005 | Kennedy et al. | 156/345.34 |

* cited by examiner

*Primary Examiner* — Maureen Gramaglia
(74) *Attorney, Agent, or Firm* — Notaro, Michalos & Zaccaria P.C.

(57) ABSTRACT

A vacuum treatment installation has a vacuum receptacle with a first planar metallic electrode face, a second dielectric electrode face facing the first planar metallic electrode face which forms a surface of a dielectric areal configuration, a metallic coupling face facing a backside of the areal configuration, electric connections on the coupling and on the first electrode face, a gas line system through the coupling face and an areal distributed pattern of apertures through the areal configuration and wherein the areal dielectric configuration is formed by several ceramic tiles.

7 Claims, 8 Drawing Sheets

VACUUM TREATMENT INSTALLATION FOR THE PRODUCTION OF A DISK-SHAPED WORKPIECE BASED ON A DIELECTRIC SUBSTRATE

CROSS-REFERENCE TO RELATED APPLICATIONS

This is a divisional of application Ser. No. 10/835,708 filed Apr. 30, 2004, which is incorporated here by reference and which is now U.S. Pat. No. 7,449,220.

FIELD AND BACKGROUND OF THE INVENTION

The present invention builds on a method for the production of a or disk-shaped workpiece based on a dielectric substrate, which production method comprises the treatment in a plasma process volume, formed between two opposing electrode faces in a vacuum receptacle.

The present invention builds on a method for the production of a disk-form workpiece based on a dielectric substrate, which production method comprises the treatment in a plasma process volume, formed between two opposing electrode faces in a vacuum receptacle.

Definition

We are defining "electrode face" as a surface freely exposed to the plasma process volume.

In said method, on which the present invention builds, an electric high-frequency field is generated between the electrode faces and therewith in the process volume charged with a reactive gas, a high-frequency plasma discharge is generated. The one electrode face is herein comprised of a dielectric material and a high-frequency potential is applied to it with a specified distribution varying along the face. The distribution of the electric field in the plasma process volume is set through the potential distribution on the dielectric electrode face. In the method forming the basis, the substrate either forms the dielectric electrode face or the substrate is disposed at the second electrode face developed metallically. Furthermore, at the electrode face opposing the substrate the reactive gas is introduced into the process volume through an aperture pattern.

In recent years increased effort has been exerted to produce larger disk-form workpieces incorporating reactive high-frequency plasma-enhanced methods. One of the reasons was the wish to reduce the production costs. High-frequency plasma enhanced methods ($P_{Hf}$ECVD) are employed for substrate coating or as reactive high-frequency plasma-enhanced etching methods. Said efforts can be seen in particular in the production of liquid crystal displays (LCD), of TFT or plasma displays, as well as in the field of photovoltaics, and therein especially in the field of solar cell production.

When carrying out such production methods by means of said high-frequency plasmas-enhanced reactive methods with the known use of areal metal electrodes opposing one another in parallel, each with a planar electrode face facing the process volume in a vacuum receptacle and applying the electric high-frequency field for the plasma excitation, it was observed that with substrates increasing in size and/or increasingly higher excitations frequency $f_{Hf}$ the dimension of the vacuum receptacle, in top view onto the substrate, is no longer of secondary importance. This is especially true in view of the wavelength of the applied high-frequency electromagnetic field in a vacuum. The distribution of the electric high-frequency field in the vacuum chamber, viewed parallel to the electrode faces, becomes inhomogeneous and to some extent differs decisively from a mean value, which leads to the inhomogeneous treatment of the workpiece positioned on one of the electrode faces: during etching an inhomogeneous distribution of the etching action results, with coating, for example of the layer thickness, the layer material stoichiometry, etc. Such significant inhomogeneities in the treatment are not acceptable for some applications, such as in particular in the production of said liquid crystals, TFT or plasma displays, as well as in photovoltaics, and here especially in the production of solar cells. Said inhomogeneities are more pronounced the more said dimension or extent of the receptacle approaches the wavelength of the electric field in the receptacle.

To solve this problem, in principle different approaches are known:

U.S. Pat. No. 6,631,692 as well as US A 2003/0089314 discloses forming the plasma process volume between two metallic electrode faces, which are opposite one another, and to shape one or both of the opposing metallic electrode faces. The metallic electrode face, which is opposite the substrate disposed on the other electrode face or the metallic electrode face on which the substrate is supported, or both opposing metallic electrode faces are developed such that they are concave. This known approach is shown schematically in FIG. 1, in which denote:

1*a* and 2*b*: the metallic electrode faces opposing one another above the process volume, between which faces the high-frequency field E is generated, $E_r$, $E_c$: the electric field, respectively generated peripherally and centrally.

A physically fundamentally different approach, on which also the present invention builds in order to solve the above problem, is known from U.S. Pat. No. 6,228,438 by the applicant of the present application. The principle of this approach according to U.S. Pat. No. 6,228,438 will be explained in conjunction with FIG. 2, which, however, represents a realization not disclosed in said document. But this realization is intended to serve as the foundation for an understanding. One of the opposing electrode faces 2*a*, for example, as depicted is metallic. The second electrode face 2*b*, in contrast, is comprised of the dielectric material, for example a dielectric areal thin plate 4. Along the dielectric electrode face 2*b* a potential distribution $\varphi_{2b}$ is generated, which, in spite of a constant distance between the two electrode faces 2*a* and 2*b*, in the process volume PR yields a desired local field distribution, as shown for example in the margin region a stronger field $E_r$ than in the center region $E_c$. This can be realized, for example as shown in FIG. 2, thereby that a high-frequency generator 6 is coupled to the dielectric plate 4 across capacitive elements $C_R$, $C_c$ differently, according to the desired distribution. In the implementation depicted in FIG. 2, however not disclosed in said U.S. Pat. No. 6,228,438, of the principle realized in said patent, the coupling capacitors $C_R$ must be selected to have higher capacitance values than the center capacitors $C_c$. The development of the capacitors $C_R$ or $C_c$ is solved according to U.S. Pat. No. 6,228,438 in the manner depicted in FIG. 3. A dielectric 8 is provided which, on the one hand, forms the electrode face 2*b* according to FIG. 2, which simultaneously, due to its locally varying thickness d, with respect to a metallic coupling face 10 forms the locally varying capacitances $C_{R,C}$ provided according to FIG. 2. The dielectric 8 can therein, as shown in FIG. 4, be formed by a solid dielectric or by an evacuated or gas-filled hollow volume 8*a* between metallic coupling face 10 and a dielectric plate 4 forming the electrode face 2*b*. It is essential that in this hollow volume 8*a* no plasma discharge is developed.

The present invention builds on the known method according to U.S. Pat. No. 6,228,438, which was explained in principle in conjunction with FIGS. 2 to 4. In this approach the question arises of where to place a substrate to be treated in the process volume $P_R$, wether at the dielectric electrode face 2b or at the metallic electrode face 2a. Said U.S. Pat. No. 6,228,438 teaches placing dielectric substrates on the electrode face 2b or electrode face 2a, but (column 5, line 35 ff) substrates with electrically conducting surface on the metallic electrode face 2a.

It is furthermore known from said document to introduce reactive gas into the process volume and specifically distributed from an aperture pattern at the electrode face opposite the substrate to be treated. Therefore, if a dielectric substrate according to FIG. 3 or 4 is disposed on the electrode face 2b, the aperture pattern with the gas supply is to be provided on the side of the metallic electrode face 2a. If the substrate is disposed on the metallic electrode faces 2a, the aperture pattern for the reactive gas is to be provided on the side of the dielectric electrode face 2b. In this case, as is clearly evident in FIG. 4, the hollow volume 8a can be employed as equalization chamber and the reactive gas is only introduced through the metallic coupling configuration with coupling face 10 into the equalization chamber 8a and through the aperture pattern provided in dielectric plate 4 into the process volume Pr. However, it is entirely possible to fill the hollow volume 8a with a dielectric solid, be that with the material forming the dielectric electrode surface 2b or one or more to some extent different therefrom and to supply the aperture pattern through this solid via distributed lines with the reactive gas.

It can fundamentally be assumed that the combination of the aperture pattern for the inflow of the reactive gas into the process volume and the dielectric 8 or 8a according to FIG. 3 or 4 on a single electrode configuration requires significantly more effort than providing the aperture pattern on the electrode face 2a according to FIG. 3 and placing the substrate to be treated on the dielectric electrode face 2b or even developing the dielectric electrode face 2b by a dielectric substrate itself.

For it appears advantageous to separate functionally the gas inlet measures with the aperture pattern and the measures for affecting the electric field, i.e. if possible to deposit the substrate to be treated on the dielectric electrode face 2b or to structure the dielectric electrode face 2b at least partially by the substrate and to shape the gas inlet conditions through the aperture pattern on the metallic electrode face 2a.

SUMMARY OF THE INVENTION

It is the task of the present invention to propose a method for the production of a disk-form workpiece based on a dielectric substrate, by means of which workpieces provided with a special layer can be produced utilizing the method fundamentally known from U.S. Pat. No. 6,228,438. The disk-form workpieces produced in this way are to be suitable in particular for use as solar cells. This is attained thereby that the dielectric substrate, first, thus before the treatment in said high-frequency plasma process volume, is coated at least regionally with a coating material to whose specific resistance $\varrho$ applies:

$$10^{-5} \Omega cm \leq \varrho \leq 10^{-1} \Omega cm$$

and on which for the surface resistance $R_S$ of the layer applies:

$$0 < R_S \leq 10^4 \Omega_\square,$$

subsequently the coated substrate is positioned on the metallic electrode face is reactively and under plasma enhancement etched or coated in the plasma process volume.

Although, as has been stated, the aim in the known method was the separation of the function of gas inlet measures and field affecting measures and their assignment on particular electrode faces for reasons of structuring, it has now been found that the combination of precoating the dielectric substrate with said layer and the basically known $P_{Hf}$ECVD method is only successful if, after the coating, the substrate is deposited in the plasma process volume on the metallic electrode face and the field affecting measures as well as the reactive gas inlet through said aperture pattern are combined and realized on or in the proximity of the dielectric electrode face.

It has been found that after the completed coating of the dielectric substrate with the specific layer only said substrate position leads to success and therewith the function combination, which initially was considered to be rather disadvantageous, must be realized on the dielectric electrode face.

With the proposed approach, in addition, high flexibility with respect to the type of Hf plasma treatment is advantageously attained. Independently of whether or not the dielectric substrate previously coated with the specified layer is being etched or coated, further also independently of whether or not it is being coated by a $P_{Hf}$ECVD process to be dielectric up to electrically highly conducting: the particular treatment process is not affected by it as far as the effect of the field distribution measures in the plasma process volume or the gas inlet measures are concerned.

As previously stated, within the scope of the present invention the dielectric substrate is first coated with a material whose specific electric resistance $\varrho$ is significantly higher than on materials conventionally referred to as 'metallic" or "electrically conducting". The specific resistances of conventional conductor materials, such as of gold, silver, copper or aluminum are in the range from $1.7 \times 10^{-6}$ $\Omega$cm to $2.7 \times 10^{-6}$ $\Omega$cm.

Definition

The surface resistance $R_S$ is obtained from the quotient of the specific resistance $\varrho$ and the layer thickness. It has the dimension $\Omega$ indicated by the symbol $_\square$.

The surface resistance $R_S$ of a considered layer is consequently a function of the material as well as also the layer thickness.

It was found according to the present invention that the choice of the method depends not only on whether or not the surface of a dielectric substrate is precoated with a more electroconducting or less electroconducting material but critically also on the surface resistance $R_S$ of the layer in the case of said materials.

In an embodiment of the method according to the invention the distribution of the high-frequency potential at the dielectric electrode face and the inlet of reactive gas into the process volume is realized thereby that the dielectric electrode face is formed by a surface of a dielectric plate configuration facing the process volume, whose backside forms with a metallic coupling face a chamber, and the distance of the backside from the coupling face varies along these faces and that, further, the reactive gas is introduced into the chamber, then through the aperture pattern provided in the plate configuration into the process volume. On the coupling face and the other electrode face, which is electrically conducting, a high-frequency signal is applied for the plasma excitation.

Due to the varying distance between metallic coupling face and backside of the dielectric plate configuration, the capacitance distribution according to FIG. 2 is realized and the chamber volume between this backside and the metallic coupling electrode face, is simultaneously utilized as a distribution chamber for the reactive gas, which flows through the aperture pattern in the dielectric plate configuration into the process volume.

When within the scope of the present application the term "reactive gas" is used, it should be understood that under this term is also included a gas mixture of one or several reactive gases.

In view of FIG. 2, the stated dielectric plate configuration forms with its capacitance value also determined by its thickness, a portion of the coupling capacitors $C_R$ or $C_C$ depicted in FIG. 2. Therewith, in one embodiment, the dielectric plate configuration with a specified varying thickness distribution can be utilized. However, in another embodiment the dielectric plate configuration with an at least approximately constant thickness is employed. In a further embodiment, the potential distribution on the dielectric electrode face approximates from the center toward its periphery increasingly the potential on the coupling face. In the realization of the above described chamber between metallic coupling face and backside of the dielectric plate configuration this is attained, for example, thereby that the respective distance is chosen to be smaller in the peripheral region than in the central region and/or thereby that the thickness of the dielectric plate configuration is laid out such that it is less in the peripheral region than in the center region.

The capacitance value is selected to be lower in the center region than in the peripheral region. When developing this capacitance across a chamber (8a of FIG. 4), this is realized for example in that a) the metallic coupling face is developed substantially planar, the dielectric plate configuration substantially of constant thickness, and convex, when viewed from the direction of the process volume, b) the dielectric plate configuration is developed such that it is planar with substantially constant thickness, the coupling face, when viewed from the direction of the process volume, concave, c) the coupling face is developed such that it is concave, the backside of the dielectric plate configuration also, and, when viewed from the direction of the process volume, the dielectric electrode face concave, d) the coupling face is developed such that it is substantially planar, the dielectric plate configuration with planar backside parallel to the coupling face and with convex electrode face when viewed from the direction of the process volume, e) the coupling face is developed such that it is planar, likewise the electrode face, the plate backside, in contract, convex when viewed from the direction of the process volume.

If no chamber is provided, the coupling face and the electrode face can, for example, be parallel, the dielectric constant of the solid dielectric disposed between them can increase toward the periphery.

It is evident that for the optimization, on the one hand, of the field distribution in the process volume, on the other hand, of the gas inlet direction distribution into the process volume, high flexibility is given. Although the field distribution measures and the gas distribution measures are realized on the same electrode configuration, each of the two values can be optimized. It is possible to mix or combine said approaches described for example, and employ them. For example, the coupling face can be developed to be substantially planar, the dielectric plate configuration with varying thickness with the backside concave when viewed from the process volume and a convex electrode face. Moreover, it is evident to a person skilled in the art that a further layout value for the capacitance distribution explained in FIG. 2 is also the dielectric constant of the dielectric plate configuration or its distribution can be applied. By selecting different materials along the dielectric plate configuration, said capacitance distribution, and therewith the potential distribution on the dielectric electrode face, can be affected additionally or alternatively to the distance or thickness variation.

In particular the dielectric electrode face can be planar and parallel to the other electrode defining the process volume in order to realize therewith a plasma process volume of constant depth perpendicularly to the electrode faces. This preferred embodiment results for example thereby that the metallic coupling face, viewed from the process volume, is developed such that it is concave, the backside of the plate configuration planar or thereby that the backside of the dielectric plate configuration, viewed from the process volume, is developed such that it is convex, the coupling face such that it is planar or thereby that along the dielectric plate configuration of electrode face materials having different dielectric constants are employed, with planar metallic coupling face and planar plate backside parallel to it, in the peripheral region, materials having dielectric constants higher than in the center region are applied.

If it is taken into consideration that with the method according to the invention in particular large substrates with an extent of their circumscribed circle of at least 0.5 m are first coated according to the invention and subsequently are subjected to the Hf plasma treatment, it is evident that providing the above dielectric plate configuration with aperture pattern and chamber formation is demanding.

In one embodiment, therefore, the dielectric plate configuration is formed by ceramic tiles. These tiles can be mounted at a spacing in a position central with respect to the metallic coupling face. Consequently, the dielectric electrode face, due to the thermal deformation of the tiles, does not become deformed, which might have a negative effect on the field distribution and possibly the reactive gas supply into the process volume. Furthermore, the tiles of different materials with different dielectric constants, with different thicknesses and thickness profiles can be flexibly employed for the selective formation of desired plate properties. They can be employed by mutual overlapping and multilayer arrangement for the shaping of concave or convex electrode faces or configuration backsides.

It should be emphasized again that—if a chamber is formed—it is essential to prevent that in this chamber formed between metallic coupling face and backside of the dielectric plate configuration parasitic plasma discharges occur, which would eliminate the effect of this chamber as an areally distributed coupling capacitance. As is known to the person skilled in the art, this is ensured by dimensioning the spacing ratio between metallic coupling face and backside of the dielectric plate configuration, in any case less than the dark space distance valid in the particular process.

In a further embodiment of the method according to the invention the distance of the plate configuration backside varies from the metallic coupling face in one, preferably in several steps and/or the thickness of the plate varies in one, preferably in several steps. This development is realized, for example, through the use of overlapping tiles for structuring the dielectric plate configuration or when using several tile layers with locally varying layer number.

In a further embodiment the distance of the plate configuration backside from the metallic coupling face is continuously varied and/or the thickness of the plate configuration is continuously varied. This development is utilized if a substantially planar dielectric plate configuration is employed with constant thickness and the metallic coupling face, viewed from the process volume, is formed in concavely.

In a further embodiment of the production method according to the invention, in particular for solar cells, the dielectric substrate before the treatment in the plasma process volume is coated with an electrically conducting oxide, preferably an electrically conducting and transparent oxide. This coating, which is carried out before the treatment, can take place for example through reactive magnetron sputtering. Further preferred the dielectric substrate is therein coated with at least one of the following materials: ZnO, $InO_2$, $SnO_2$, therein additionally doped or undoped, with a thickness D to which applies:

10 nm≤D≤5 µm.

The coating of said materials within the stated thickness range fulfills the specific layer properties stated above with respect to the specific resistance $\varrho$ and surface resistance $R_S$.

The substrate coated in this manner is subsequently reactive etched and/or coated through treatment in the plasma process volume. Preferably as the reactive gas at least one of the following gases is utilized: $NH_3$, $N_2$, $SF_6$, $CF_4$, $Cl_2$, $O_2$, $F_2$, $CH_4$, monosilane, disilane, $H_2$, phosphine, diborane, trimethylborane, $NF_3$.

For example, the following layers are deposited:

| Layer | Reactive Gas |
| --- | --- |
| amorphous silicon (a-Si) | $SiH_4$, $H_2$ |
| n-doped a-Si | $SiH_4$, $H_2$, $PH_3$ |
| p-doped a-Si | $SiH_4$, $H_2$, TMB, $CH_4$ |
| microcrystalline Si | $SiH_4$, $H_2$ |

For reactive etching for example $SF_6$ mixed with $O_2$ is employed as the reactive gas.

Furthermore, the electric high-frequency field is preferably excited with a frequency $f_{Hf}$, to which applies:

10 MHz≤$f_{Hf}$≤500 MHz or

13 MHz≤$f_{Hf}$≤70 MHz.

The produced workpieces preferably have further a radius of the circumscribed circle which is at least 0.5 m.

A vacuum treatment installation utilized within the scope of the method according to the invention has
 a vacuum receptacle, therein
 a first planar, metallic electrode face,
 a second dielectric electrode face opposing the first, which forms the one surface of a dielectric plate configuration,
 a metallic coupling face facing the backside of the dielectric plate configuration,
 electric connections on each the coupling and the first electrode face,
 a gas line system, which opens through the coupling face and a distributed pattern of apertures through the plate configuration, and
is distinguished thereby that the plate configuration is formed by several ceramic tiles.

Embodiments of the vacuum treatment installation utilized according to the invention will readily present themselves to a person skilled in the art in the claims as well as the following description by example of the invention.

BRIEF DESCRIPTION OF THE DRAWINGS

The invention will be described further in the following in conjunction with embodiment examples and figures. Therein depict.

DESCRIPTION OF THE PREFERRED EMBODIMENTS

Figure 1:
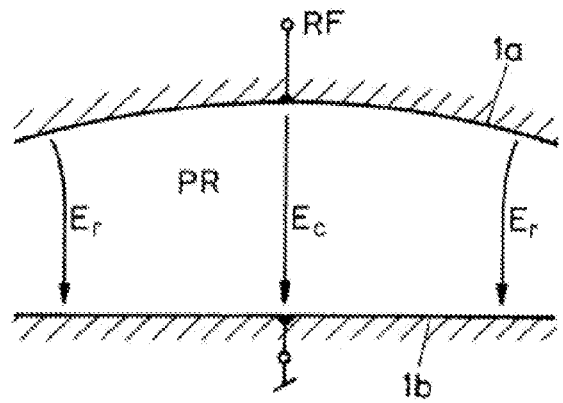
FIG. 1 is a side sectional and schematic view of a known metallic electrode face which is opposite a substrate disposed on another electrode face.
Figure 2:
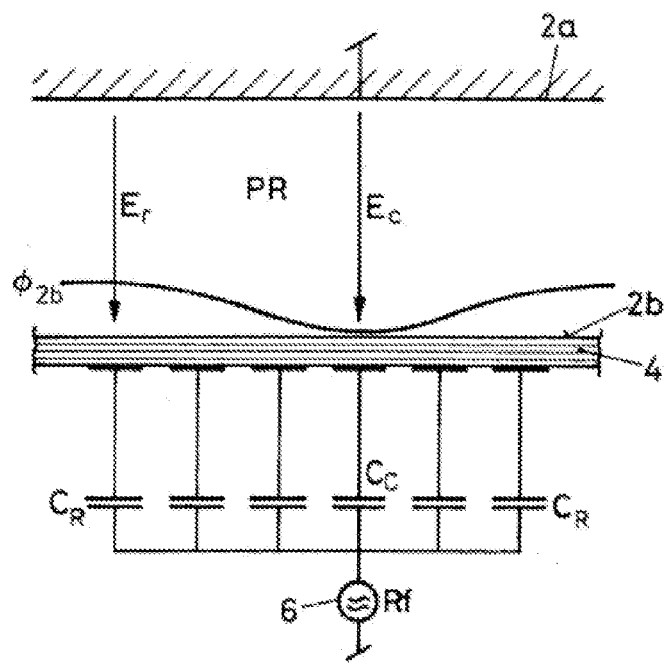
FIG. 2 is a schematic illustration of a known arrangement according to U.S. Pat. No. 6,228,438.
Figure 3:
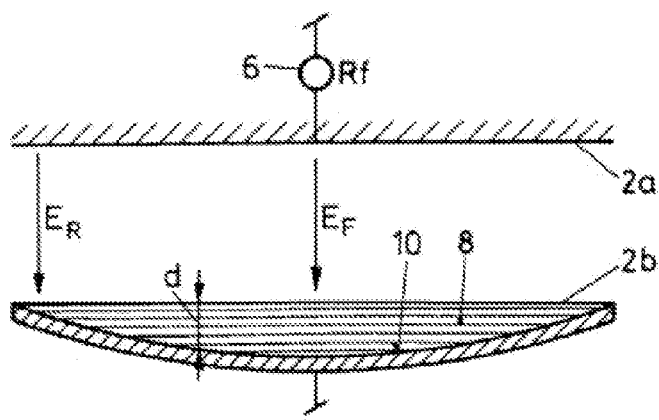
FIG. 3 is a view of the known capacitors $C_R$ or $C_c$ according to U.S. Pat. No. 6,228,438.
Figure 4:
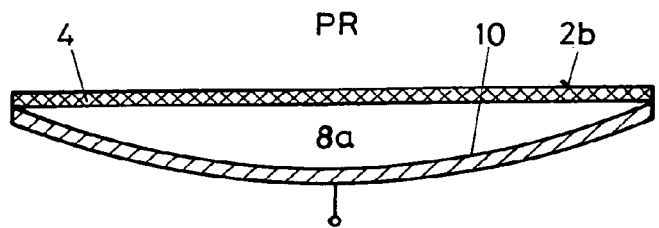
FIG. 4 is a view of a known arrangement where a dielectric is formed by a solid dielectric or by an evacuated or gas-filled hollow volume between a metallic coupling face and a dielectric plate forming the electrode face, FIG. 5 schematically the sequence of the production method according to the invention in conjunction with a function block diagram, FIG. 6 in cross section schematically and simplified, an embodiment of a vacuum treatment installation utilized within the scope of the method according to the invention, FIG. 7 further simplified, the view onto a coupling face utilized in the installation according to FIG. 6, FIG. 8 as a reference example, the resulting layer thickness distribution over the diagonals on a rectangular dielectric substrate with $P_{Hf}$ECVD coating utilizing conventional opposing planar metallic electrodes, FIG. 9 as a reference example and depicted analogously to FIG. 8, the distribution result on a dielectric substrate, positioned directly above a concavely formed-in metallic electrode face, FIG. 10 further as a reference example and depicted analogously to FIGS. 8 and 9, the result when proceeding according to FIG. 9, however on a substrate coated according to the invention with an $InO_2$ layer, FIG. 11 the layer thickness distribution profile resulting when using the method according to the invention, FIG. 12 simplified and schematically an installation according to the invention utilized for carrying out the method according to the invention in a further preferred embodiment, FIG. 13 a detail from the region denoted by "A" in FIG. 12 to explain a further preferred embodiment, FIG. 14 represented analogously to that of FIG. 12 a further embodiment of the installation used according to the invention, FIG. 15(a) to (f) schematically a selection of feasibilities for increasing the electric field peripherally in the process volume through the corresponding shaping of the dielectric plate configuration and the metallic coupling face, FIG. 16 in detail a preferred mounting of a ceramic tile for forming the dielectric plate configuration on the metallic coupling face, and FIG. 17 the realization of the feasibilities presented by example in FIG. 15 by structuring the dielectric plate by means of ceramic tiles.
Figure 5:
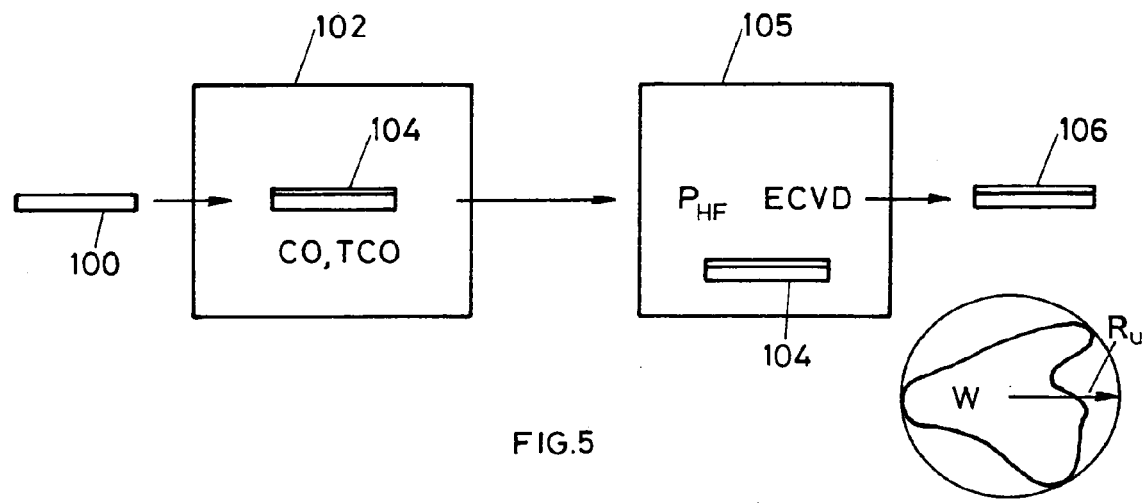

In conjunction with a simplified block diagram the sequence of the method according to the invention is depicted in FIG. 5. A dielectric substrate 100 is at least partially coated in a first vacuum coating station 102, for example a station for reactive magnetron sputtering, with a layer whose material has a specific resistance ϱ, for which applies $$10^{-5}\ \Omega cm \leq \varrho \leq 10^{-1}\ \Omega cm$$

and specifically such, that the resulting surface resistance $R_S$ of the layer is in the following range:

$$0 < R_S \leq 10^4\ \Omega_\square.$$

The lower limit can approximate 0, since the surface resistance $R_S$ is a function of the thickness of the deposited layer. This thickness $D_S$ of the layer is preferably selected as follows:

$$10\ nm \leq D_S \leq 5\ \mu m,$$

especially if the deposited layer material, as is far preferred, is an electrically conducting oxide (CO), optionally a transparent electrically conducting (TCO). For this purpose at least one of the following materials $InO_2$, $ZnO$ or $SnO_2$ is deposited on the dielectric substrate 100 in doped or undoped form. The coated dielectric substrate 104 is subsequently transported to a reactive Hf plasma treatment step in station 105, namely to a $P_{Hf}ECVD$ treatment step, or to a reactive Hf plasma enhanced etching step. A workpiece 106 results, which is suitable in particular for use as solar cells.

The substrate 100, and thus also the substrate 106, resulting according to the invention has therein preferably a radius of the circumscribed circle $R_U$ of at least 0.25 m, corresponding to a diameter of the circumscribed circle of 0.5 m, as is depicted in FIG. 5 on a workpiece W formed in any desired shape.

Figure 6:
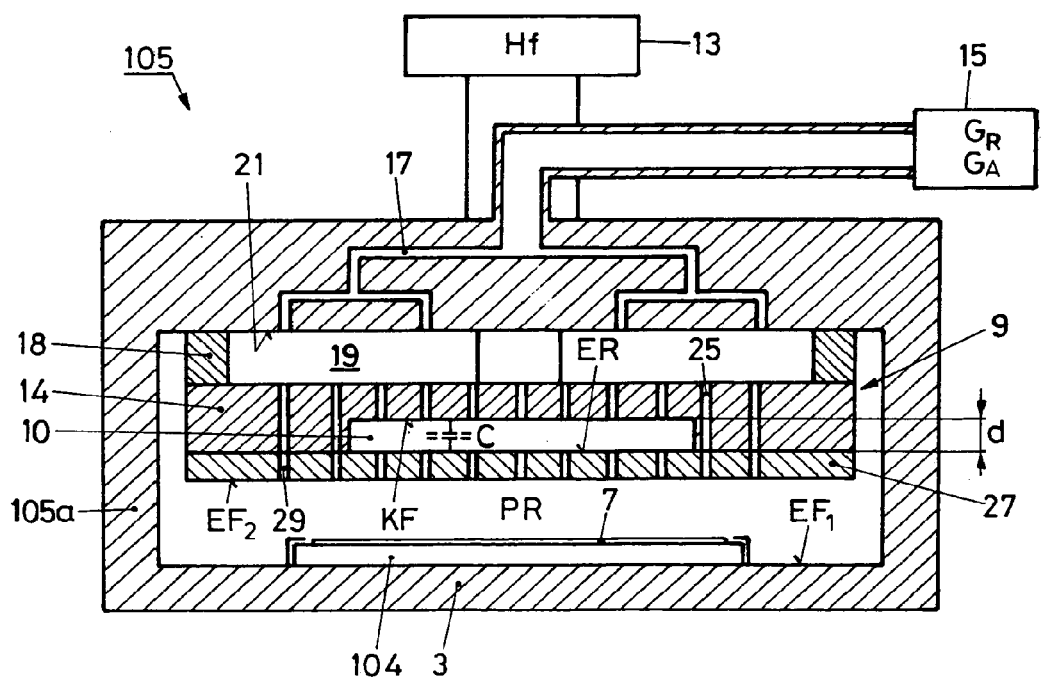

In FIG. 6, a first embodiment of an inventive station or installation 105 according to FIG. 5 and utilized according to the invention, is shown in cross section and simplified. A metallic vacuum receptacle 105a has a planar base 3, which, facing the interior volume, forms a first electrode face $EF_1$. Thereon lies the substrate 104 of a dielectric material, coated -7- with said layer material.

Opposite the substrate 104 provided with layer 7 or the first electrode face $EF_1$, is mounted an electrode configuration 9. It forms the second electrode face $EF_2$.

The second electrode face $EF_2$, in the depicted example it is disposed planar opposite the electrode face $EF_1$, is formed by the surface of a dielectric plate configuration 27. The backside ER of the dielectric plate configuration 27 forms together with a metallic coupling face KF a chamber 10. In the depicted example the coupling face KF is developed as a formation-in 10, which, viewed from the process volume PR, is concavely worked into a metal plate 14. As shown schematically in FIG. 7, the formation-in 10 depicted in the example is rectangular and forms a distance distribution of distance d between coupling face KF and backside ER of the dielectric plate configuration 27, which abruptly jumps from 0 to the constant distance in the formation-in 10. The substrate 104 is entered in dashed lines in FIG. 7. Via the metal plate 14 a high-frequency generator 13 is connected with the coupling face KF, which is further connected with the electrode face $EF_1$ which is conventionally at reference potential.

From a gas reservoir 15 reactive gas $G_R$ or a reactive gas mixture and optionally an working gas $G_A$, such as for example argon, is introduced via a distribution line system 17 into an pre-chamber 19 to the rear of plate 14. The pre-chamber 19 is, on the one hand, rimmed by a mounting 18 isolating the plate 14 with respect to the receptacle 105a, on the other hand, formed by the backside of plate 14 and the front wall 21 of the receptacle 105a facing the metallic electrode face $EF_1$. Plate 14 has a pattern of gas line bores 25 led through it.

The gas line apertures 25 in plate 14 continue, preferably aligned, into openings 29 through the dielectric plate configuration 27. The plate configuration 27 in this example is comprised of a ceramic, for example of $Al_2O_3$.

By means of generator 13, via the coupling face KF a high-frequency plasma discharge is generated in the process volume PR.

From the metallic coupling face KF via the areally distributed capacitance C, entered in FIG. 6 in dashed lines, at the dielectric electrode face $EF_2$ a selectively specified potential distribution was realized as has already been explained.

The excitation frequency $f_{Hf}$ is selected as follows:

$$10\ MHz \leq f_{Hf} \leq 500\ MHz$$

therein especially $$13\ MHz \leq f_{Hf} \leq 70\ MHz.$$

The diameter of the circumscribed circle of the substrate 104 is at least 0.5 m and can be entirely up to 5 m and more.

In the embodiment according to FIG. 6 the distance d changes abruptly from 0 to 1 mm.

As stated above, in the embodiment variants of the installation according to the invention yet to be discussed, the chamber 10 is not laid out with a distance d changing abruptly from 0 to a constant value, but rather said distance, which, after all, contributes decisively to the determination of the capacitance distribution which is critical for the field distribution, is optimized and laid out with a specific distribution. This distance d is selected, depending on the frequency, to be between 0.05 mm and 50 mm so that no plasma can form in chamber 10.

By means of generator 13 a power of 10 to 5000 W/m² per substrate area is preferably supplied.

For $P_{Hf}ECVD$ coating of substrate 104 preferably at least one of the following is used as the reactive gas: $NH_3$, $N_2$, $SF_6$, $CF_4$, $Cl_2$, $O_2$, $F_2$, $CH_4$, monosilane, $H_2$, phosphine, diborane or trimethylborane.

Lastly, the total gas flow through the system 15, 17 from apertures 29 is for example between 0.05 and 10 slm/m² per m² of substrate area.

The above stated values apply in particular to reactive high-frequency plasma-enhanced coating.

For the subsequent experiments the following values were set:

| | |
|---|---|
| Process: | $P_{Hf}ECVD$ coating |
| $f_{Hf}$: | 27 MHz |
| Substrate dimension: | 1.1 × 1.25 m² |
| Depth of formation-in d according to FIG. 6: | 1 mm |
| Total pressure: | 0.22 mbar |
| Power per substrate area: | 280 W/m² |
| Substrate material: | float glass with specific conductivity: $10^{-15}\ (\Omega\ m)^{-1}$ |
| Prior applied coating: | $InO_2$ doped with tin |
| Surface resistance $R_S$ of the coating: | 3 $\Omega_\square$ |
| Reactive gas: | monosilane with the addition of $H_2$ |
| Dilution of monosilane in $H_2$: | 50% |
| Total gas flow per unit area: | 0.75 slm/m² |

Figure 7:
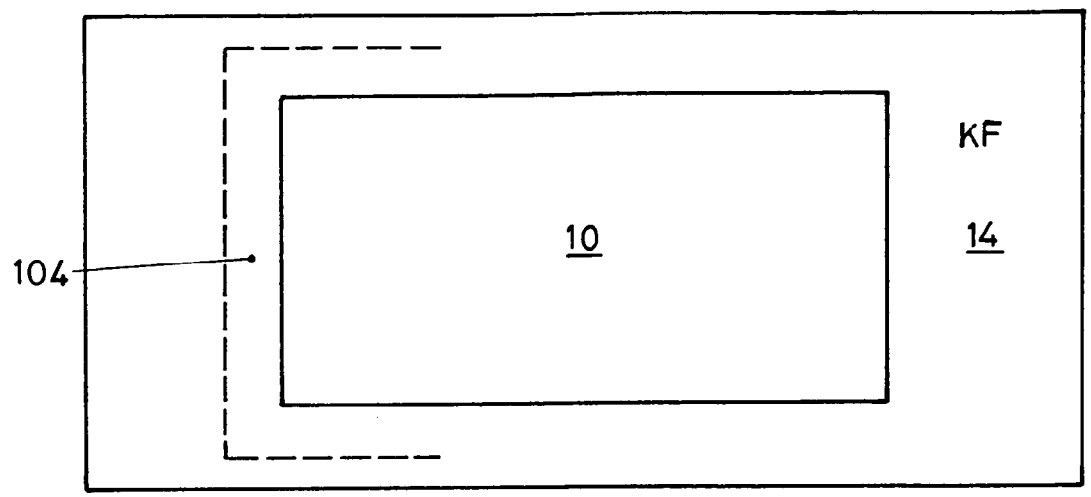

The experiments were carried out in the installation configurations according to FIG. 6 or 7.

Figure 8:
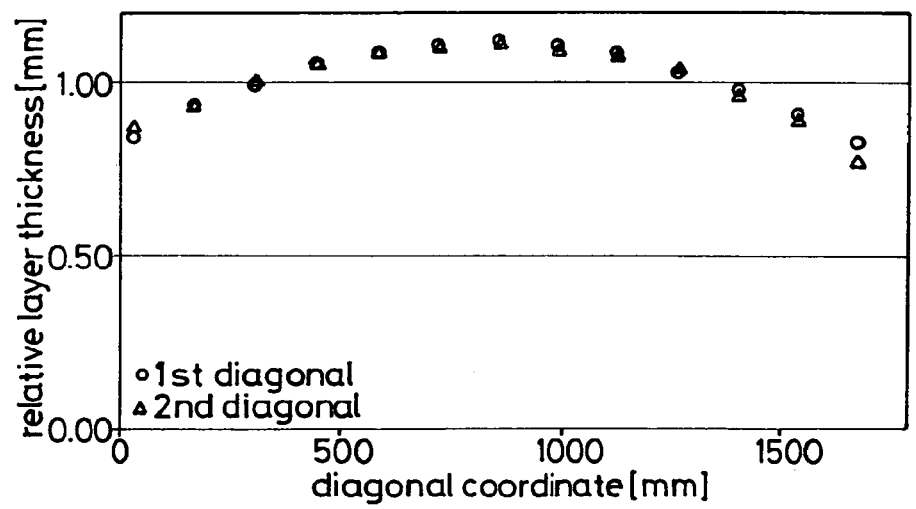

As a reference result is shown in FIG. 8 the resulting layer thickness distribution in nanometers with respect to the mean layer thickness value measured over both diagonals of the rectangle of the workpiece, if on the configuration according to FIG. 6 the plate 14 without formation-in 10 with a planar metallic face is employed directly as the electrode face opposite the electrode face $EF_1$.

Figure 9:
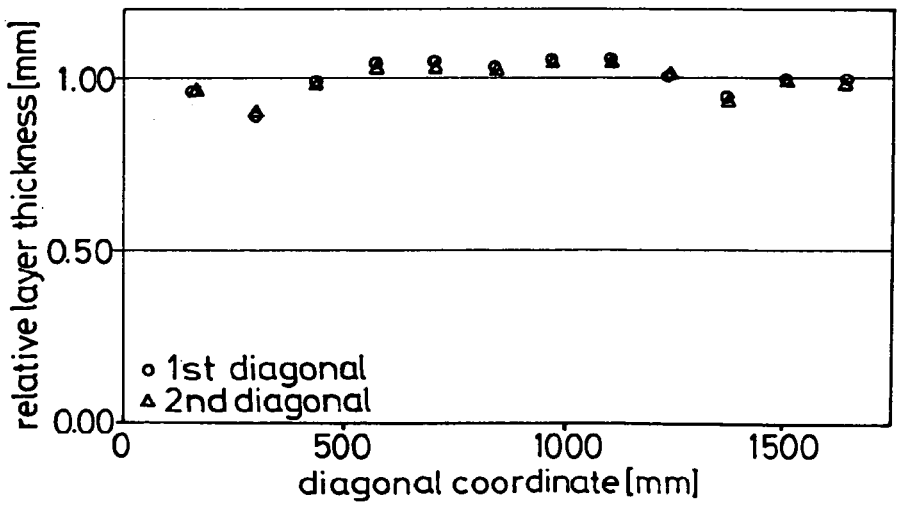

Analogously to the representation in FIG. 8, in FIG. 9, furthermore as reference, the result is shown which is obtained if, on the one hand, as the workpiece to be coated an uncoated dielectric substrate 100 according to FIG. 5, namely a float glass substrate is placed in position.

Furthermore, as was already the case for the measurement according to FIG. 8, the plate is developed without formation-in 10 and forms one of the electrodes in the process volume PR. However, an formation-in corresponding to the formation-in 10 is provided on the base 3 beneath the substrate.

Figure 10:
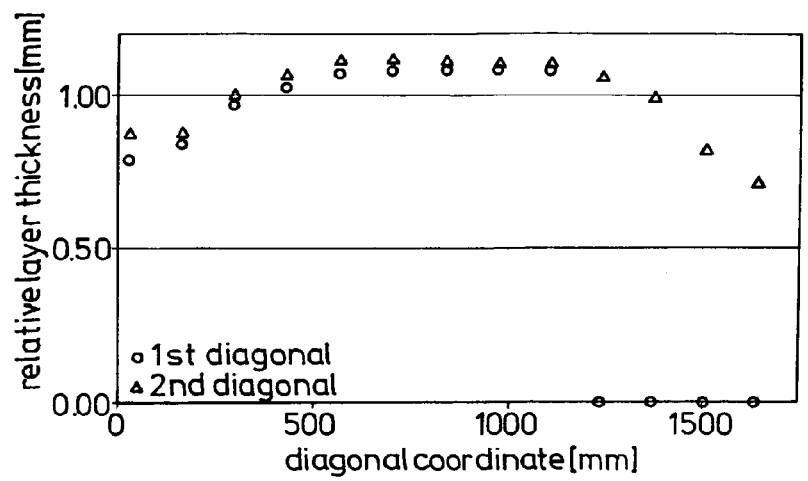

Again in analogous representation and as a reference, FIG. 10 shows the result if in the installation configuration, such as was also used for the results according to FIG. 9, i.e. with the formation-in 10 in the base 3, covered by the substrate and with the development of the second electrode face by the planar surface, exposed to the process volume PR, of plate 14, the precoated substrate 104 is treated, namely the float glass substrate precoated with $InO_2$.

The following results:

From FIG. 8: that due to the inhomogeneous field distribution in the process volume PR, the resulting coating thickness distribution is unacceptably inhomogeneous.

From FIG. 9: that if the substrate to be treated is purely dielectric, the formation-in on the workpiece-supporting electrode (3) leads to a significant improvement of the field distribution and therewith to layer thickness distribution homogeneity.

From FIG. 10: that the configuration, which for a purely dielectric workpiece according to FIG. 9 leads to a significant improvement of the layer thickness distribution, in the case in which the workpiece is comprised of a substrate 104 precoated according to the invention, leads to an unacceptable layer thickness distribution.

Figure 11:
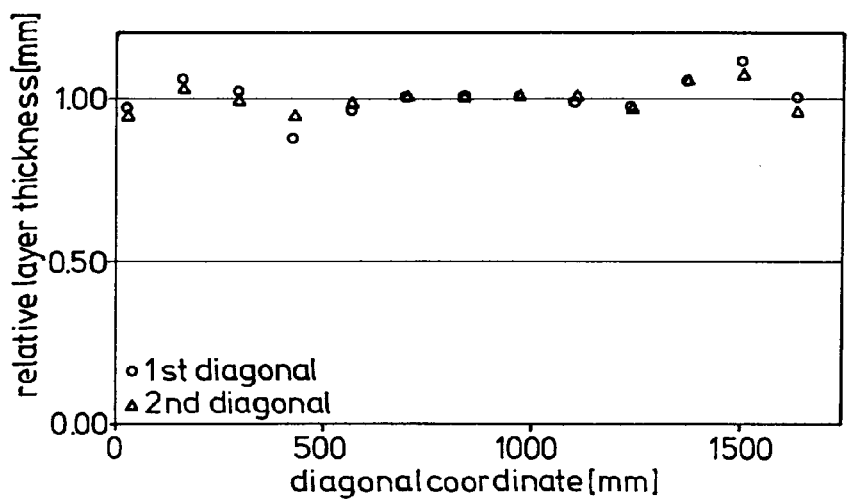

But if, according to the invention, said precoated substrate is coated for example with the installation according to FIG. 6, the good layer thickness distribution shown in FIG. 11 results.

It is evident that, in spite of the high specific resistance $\varrho$ of the layer material ($InO_2$), exclusively the process proposed according to the present invention is surprisingly suitable for attaining the homogeneous action distribution on the workpiece.

Figure 12:
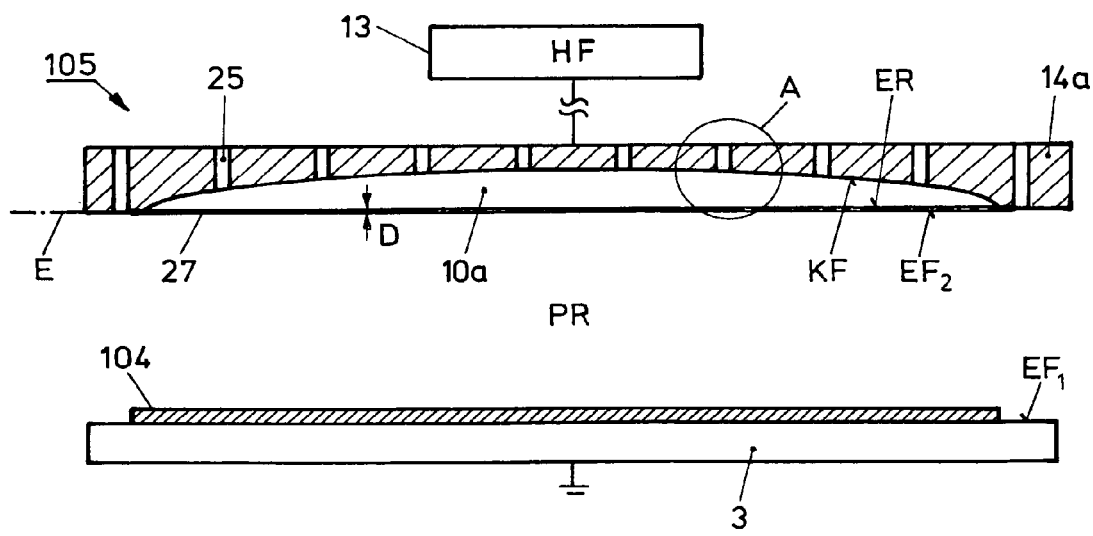

Additionally simplified and schematically, in FIG. 12 is depicted a further preferred embodiment of the treatment step according to the invention or of the installation 105 according to FIG. 5 employed for this purpose.

The precoated substrate 104 is again placed onto the planar first electrode face $EF_1$. The metallic coupling face KF connected with the high-frequency generator 13 is formed in as a continuous concavity.

The dielectric plate configuration 27 forms, on the one hand, the planar dielectric electrode face $EF_2$ and, of constant thickness, the backside ER which is also planar. In FIG. 12 the aperture pattern through the dielectric plate configuration 27 is not shown. The dielectric plate configuration 27 has a thickness D, to which preferably applies:

$$0.01 \text{ mm} \leq d \leq 5 \text{ mm}.$$

Definition

By the term dielectric plate configuration is understood in the context of the present invention an areal dielectric formation extending in two dimensions and manifest in the form of films or foils up to plates.

Since the capacitance of the dielectric plate configuration 27 is manifest in series with the capacitance between coupling face KF and backside ER of the dielectric plate, the possibly large plate capacitance resulting in the case of a thin dielectric plate configuration 27 is not significantly capable of affecting the small capacitance across the chamber 10a.

Figure 13:
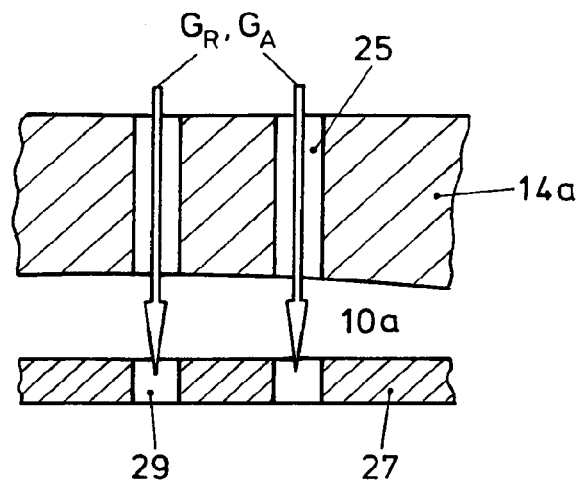

FIG. 13 shows a detail, encircled at A, of the configuration according to FIG. 12. It is evident that at least a portion of the bores 25 through the metal plate 14a in the embodiment according to FIG. 12, as well as also in all other embodiments according to the invention, can be aligned with apertures 29 (not shown) through the dielectric plate configuration 27 further can at least approximately have identical aperture cross sections.

Although the coupling face KF in FIG. 12 has a continuous curvature, it is readily possibly to realize it formed in one step or in several steps. As the material of the plate configuration 27, which is exposed to high temperature loading, an aggressive chemical atmosphere, high vacuum and the plasma, as stated, a ceramic, for example $Al_2O_3$ can be utilized. Depending on the process, other dielectric materials can optionally also be employed up to high-temperature-resistant dielectric foils with the aperture pattern.

Figure 14:
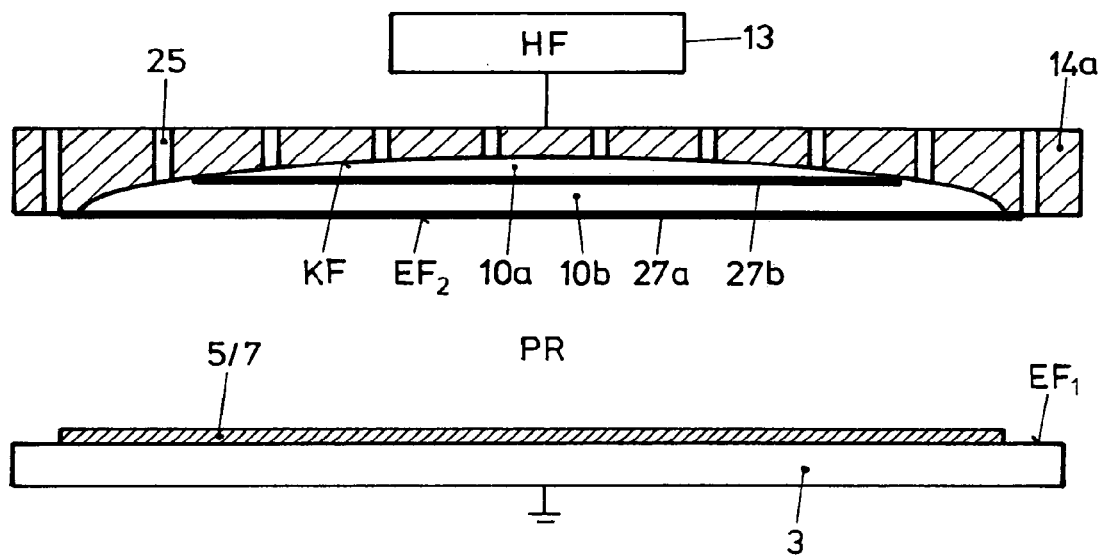
Figure 15:
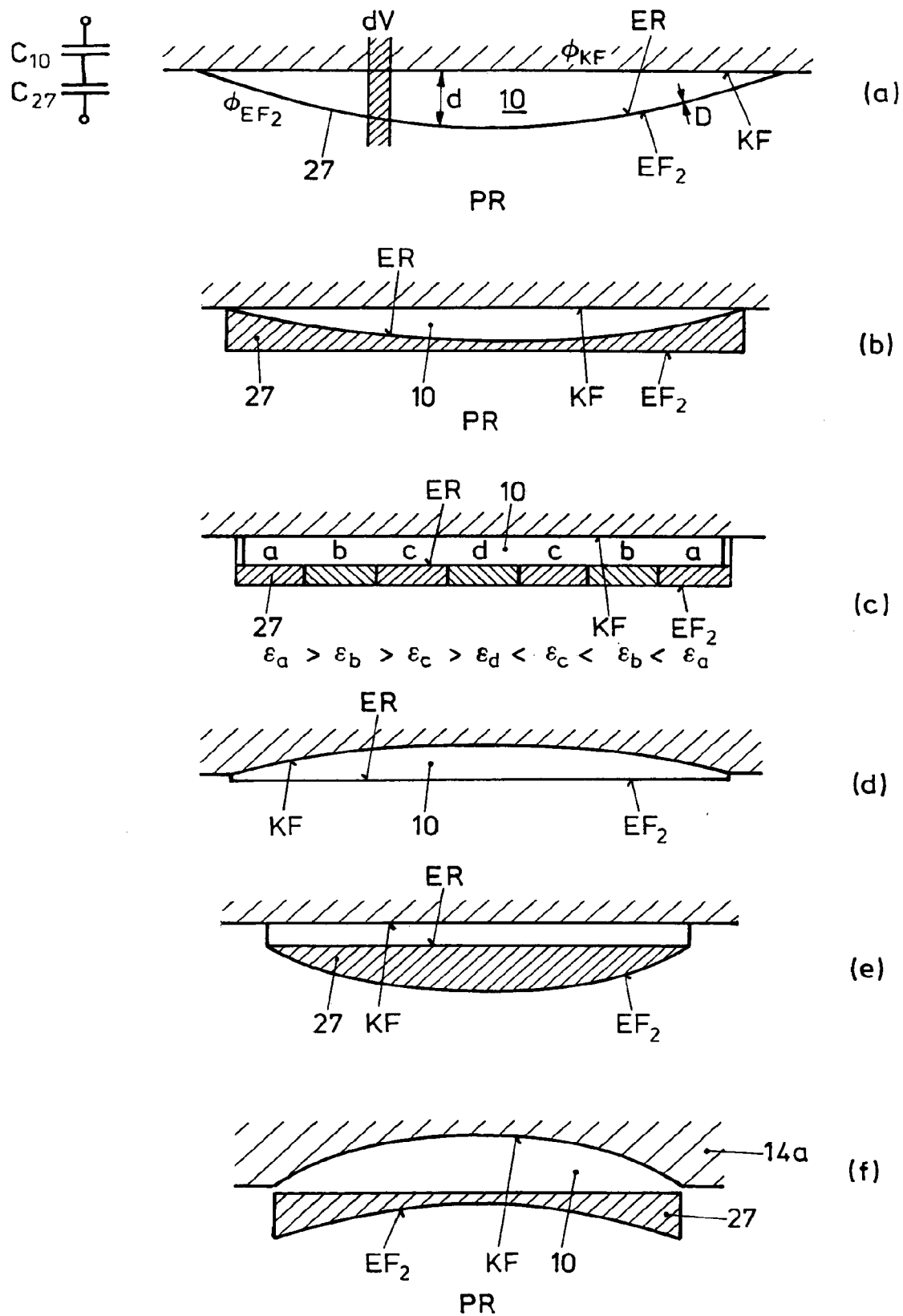

As shown in FIG. 14, said dielectric plate configuration 27 can be replaced by several plate configurations 27a, 27b spaced apart and one disposed above the other, which are positioned relative to one another by dielectric spacers. All of these individual plates 27a, 27b have the aperture pattern in analogy to the pattern of the apertures 29 according to FIGS. 6 and 12 and 13. Its thickness can again be between 0.01 and 5 mm.

In FIG. 15(a) to (f) feasible mutual assignments of metallic coupling face KF and dielectric electrode face $EF_2$ are shown schematically. All of them lead to the fact that in the process volume PR, the electric field in the peripheral region is intensified with respect to the field in the center region.

In FIG. 15(a) the metallic coupling face KF is planar. The dielectric plate configuration 27 is convex with respect to the process volume PR and of constant thickness D. Due to its metallic properties, the coupling face KF under the action of a high-frequency potential functions as an equipotential face with $\phi_{Hf}$. As a first approximation the configuration according to FIG. 15(a) can be viewed as follows: at each volume element dV along chamber 10 the series connection results of a capacitor $C_{10}$ and $C_{27}$ as shown on the left in the Figure. While the capacitance $C_{10}$ is determined by the varying distance between coupling face KF and backside ER of the dielectric plate configuration 27 as well as the dielectric constant of the gas in chamber 10, the capacitance $C_{27}$ is locally constant, due to the constant thickness D and the dielectric constant C of the plate configuration 27.

The dielectric constant of the plate material is conventionally significantly greater than that of the gas in chamber 10, wherewith especially with a thin plate configuration 27, the capacitance $C_{27}$ connected in series with $C_{10}$, becomes negligible at least in a first approximation. In the peripheral region of the dielectric electrode face $EF_2$, $C_{10}$ becomes increasingly greater due to the decreasing distance d, and consequently locally the potential distribution $\phi_{EF2}$ along the electrode face $EF_2$ as it approaches the peripheral region approximates the potential $\phi_{KF}$ of the coupling face KF. Consequently, over the process volume PR lies in the peripheral region of the electrode face $EF_2$ the approximate entire potential difference between $\phi_{KF}$ and the potential applied at the counterelectrode face $EF_1$. In the center region of the electrode face $EF_2$, due to the greater distance d, $C_{10}$ is smaller than in the peripheral region, and thus a greater high-frequency voltage drop occurs thereon and consequently here the potential $\phi_{EF2}$ has a greater decrease relative to potential $\phi_{KF}$. Consequently, over the process volume PR now an electric field is present in this center region which is decreased relative to the peripheral region.

Based on the examination of FIG. 15(a) and taking into consideration the fact that chamber 10 is a pressure equalization chamber for the reactive gas supplied from the aperture pattern (not shown) through the dielectric plate configuration 27 to the process volume PR, it is evident that by using a foil-like high temperature-resistant plate configuration 27, the convex shaping can advantageously be generated due to the pressure difference between process volume and chamber 10.

In FIG. 15(b) further the metallic coupling face KF is planar. The dielectric plate configuration 27 has a backside ER which with respect to the process volume PR, is formed convex, but a planar electrode face $EF_2$ parallel to the coupling face KF. Due to the conventionally higher dielectric constant $\in$ of the material of the dielectric plate configuration 27, the capacitance $C_{27}$ affects the capacitance $C_{10}$ (s. FIG. 15(a)) only insignificantly in the peripheral region, in spite of greater thickness of the configuration 27, such that in the embodiment according to FIG. 15(b) the locally varying capacitance $C_{10}$ in series connection dominates and, as has been explained, the major effect was exerted on the field distribution in process volume PR.

In the embodiment according to FIG. 15(c) the coupling face KF is also planar. The dielectric plate configuration 27 has a constant thickness, but, in contrast, is formed by sectionally different materials of differing dielectric constants $\in$a to $\in$d. Here the chamber 10 can be omitted.

Toward the periphery the dielectric constant C of the plate material increases, and thus, in view of the equivalent circuit diagram in FIG. 15(a), $C_{27}$ increases. In this embodiment the capacitance $C_{10}$ formed by the chamber 10 is locally constant. If here the constant thickness of the dielectric plate configuration 27 is sufficiently large, the capacitance $C_{27}$ increasing toward the peripheral region in series with $C_{10}$ becomes dominant and the already described effect is attained: in the margin region of the electrode face $EF_2$ the electric field in process volume PR is attenuated less than in the central region, where $C_{27}$ with $\in_d$ is decreased relative to $C_{27}$ with $\in_a$.

FIG. 15(d) shows the already explained conditions according to FIG. 6 and FIG. 12.

FIG. 15(e) shows a planar coupling face KF. The dielectric plate 27 has a planar backside E parallel to coupling face KF, however, viewed from the process volume PR, a convex dielectric electrode face $EF_2$. Based on the explanation up to this point, a person skilled in the art can readily infer that therewith the same field compensation effect can be achieved in the process volume PR as has been explained up to now, according to the selected plate thickness and the plate material dielectric constants.

In FIG. 15(f) the coupling face KF as well as also the electrode face $EF_2$ is concave with respect to the process volume PR, however, the backside ER of plate configuration 27 is planar.

If the dielectric constant of the plate configuration 27 is substantially greater than that of the gas in chamber 10, then $C_{10}$ also dominates here and yields the desired field distribution in process volume PR.

Based on FIGS. 15(a) to (f) it is evident that there is a high degree of flexibility especially with respect to the form of the dielectric electrode face $EF_2$. As a person skilled in the art recognizes readily, the variants depicted in FIG. 15 can be expanded and combined, as, for example, providing different materials on the plate configuration 27 combined with varying thickness, etc., which further increases the leeway with respect to layout. As was already stated, chamber 10 can be omitted and the capacitance distribution can exclusively be realized through the plate configuration 27.

If it is considered that the reactive gas is introduced into the process volume through the aperture pattern provided on the plate configuration 27 and further that the desired field compensation measures can be largely realized independently of the form of the electrode face $EF_2$, it becomes evident that it is possible to optimize simultaneously the direction of the gas injection into the process volume PR as well as affecting the field in the process volume PR.

In realizing the dielectric plate configuration 27 it must be taken into consideration that it is exposed during the treatment process especially to high temperatures. Therewith thermal differences of expansion between dielectric plate configuration 27 and, via its securement, the plate 14 forming the coupling face KF. It must further be considered that with the described installation large, even very large, substrates 104 are to be treated. The realization of a dielectric plate configuration of this size as well as its mounting in a manner that thermal expansions and contractions can in every case be absorbed without deformations, represents problems especially if the configuration 27 is not of foil type, but rather as a rigid dielectric plate is comprised for example of a ceramic, such as $Al_2O_3$.

Figure 16:
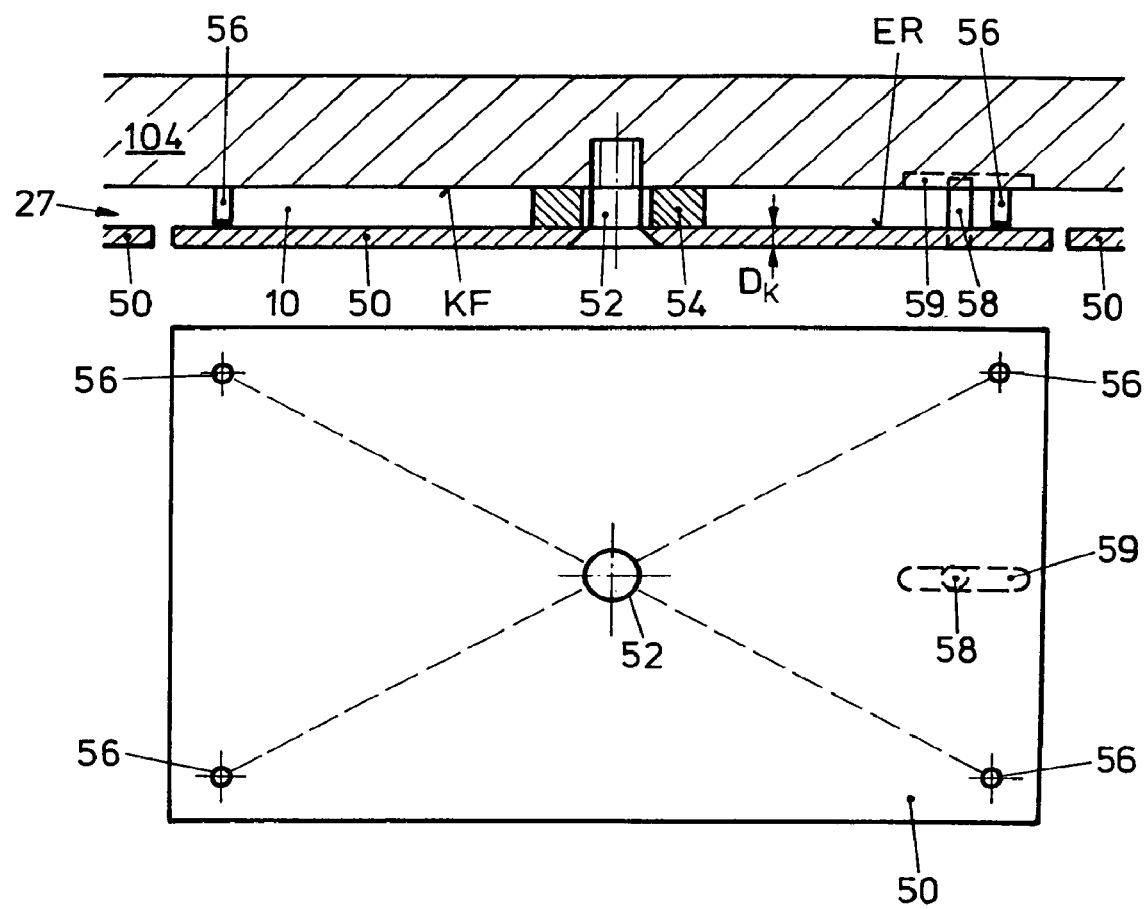
Figure 17:
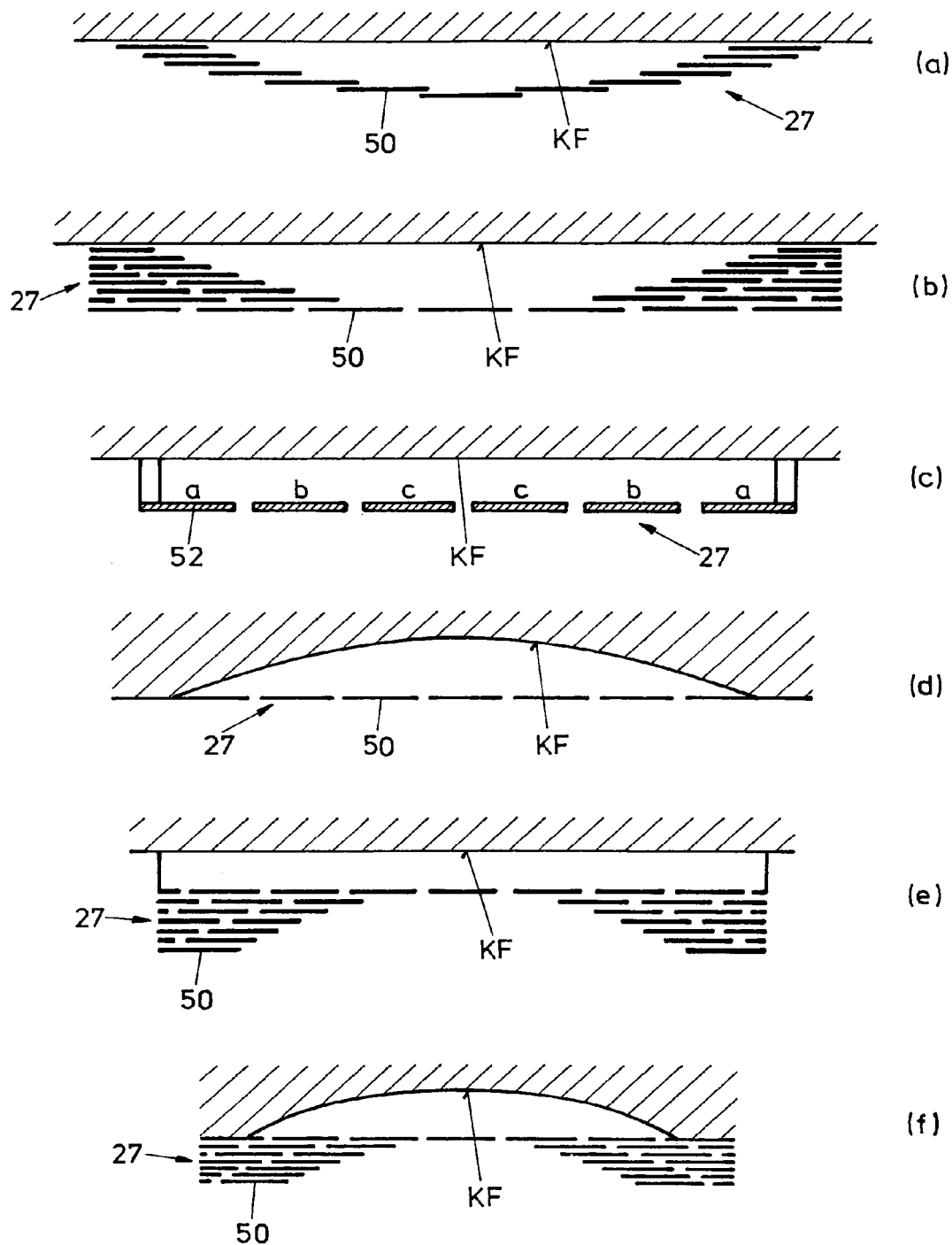

In an embodiment preferred in this case the solid configuration 27, as will be explained in conjunction with FIG. 16, is composed of a large number of dielectric, preferably ceramic, tiles. In FIG. 16 a view of such a tile and its mounting is shown and depicted in cross section. The particular tile 50, which, as shown, is preferably rectangular or square and fabricated of a ceramic material, such as for example $Al_2O_3$, is positioned substantially centrally relative to the coupling face KF on plate 104 by means of a dielectric spacer bolt 52, such as for example a ceramic bolt, as well as by means of a dielectric washer 54. Thereby the relevant distance between face KF and backside ER of the tiles 50 forming the plate configuration 27 is ensured. So that the tiles 50 are peripherally supported and yet can nevertheless freely expand without tension on all sides under thermal loading, they are guided on support pins 56 with respect to the coupling face KF. The tiles 50 are secured against twisting by means of a guide pin 58 in a slot guidance 59. The tiles 50 are provided with the aperture pattern not shown in FIG. 16, which, if necessary, is supplemented by gaps between the tiles 50. The tiles 50 can optionally also overlap. One or several layers of such tiles can be provided, optionally locally varying, and different ceramic materials, especially with differing dielectric constants can be employed in different regions. Therewith flexibly different formations and material profiles can be realized on the dielectric plate configuration 27.

In FIG. 17(a) to (f) the configurations according to FIG. 15(a) to (f) are shown schematically, which are structured by means of tiles preferably as explained in conjunction with FIG. 16. Only the tiles disposed directly opposite the coupling face KF according to FIG. 17 must be supported, layers of tiles adjacent on the side of the process volume are mounted on the subjacent tiles. When examining FIGS. 17(a) to (f) a person skilled in the art readily understands the manner of said preferred tile structuring of the configurations according to FIGS. 15(a) to (f). In accordance with said aperture pattern, the gas injection into the process volume distributed to the desired extent, must be ensured, be that by utilizing the labyrinth channels remaining between the tiles and/or by providing additional bores or apertures through the tiles 50 (not shown).

The thickness of the ceramic tiles $D_K$ is preferably $$0.1 \text{ mm} \leq D_K \leq 2 \text{ mm}.$$

With the production method according to the invention or the installation utilized according to the invention, homogeneously large, even very large, dielectric substrates can be, first, coated with special conducting layers, subsequently be surface-treated, in particular coated, by reactive high-frequency plasma-enhanced methods, whereby in particular large, up to very large, solar cells can be produced on an industrial scale.

What is claimed is:

1. A vacuum treatment installation comprising:
    a vacuum receptacle (105*a*);
    a first planar metallic electrode face ($EF_1$) in the receptacle, a second dielectric electrode face ($EF_2$) facing the first planar metallic electrode face, the second dielectric electrode face forming a surface of a dielectric areal configuration (27);
    a metallic coupling face (KF) facing a backside (ER) of the areal configuration (27);
    electric connections on the coupling face (KF) and on the first electrode face ($EF_1$);
    a gas line system (17) through the coupling face (KF) and through an areal distributed pattern of apertures (29) in the areal dielectric configuration (27) connected to said gas line system (17) through the areal configuration (27);
    the areal dielectric configuration (27) comprising a plurality of mutually distant ceramic tiles (50), said areal distributed pattern of apertures through said areal dielectric configuration being formed by gaps mutually separating said ceramic tiles (50).

2. The installation as claimed in claim 1, wherein at least a portion of the tiles (50) is mounted on the metallic coupling face (KF) with dielectric supports (52) disposed at least approximately at each respective tile center.

3. The installation as claimed in claim 1, wherein the tiles (50) span the dielectric electrode face (EF2) when viewed from the first electrode face, one of planarly, convexly and concavely.

4. The installation as claimed in claim 1, wherein the coupling face (KF), viewed from the first (EF1) electrode face has a shape selected from the group consisting of a stepped shape and a continuously concave shape.

5. The installation as claimed in claim 1, including gas inlet openings in the metallic coupling face (KF), a majority of the gas inlet openings being aligned with the apertures (29) of the pattern and having identical aperture cross sections.

6. The installation as claimed in claim 1, wherein at least a portion of the tiles (50) are secured against twisting by at least one guidance pin (58) in a slot guidance (59).

7. The installation as claimed in claim 1, wherein at least a portion of the tiles (50) is supported by spacer pins (56) with respect to the coupling face (KF) and, relative to the coupling face, so that the tiles that are supported by the spacer pins are freely movable in a direction of their areal extent.

\* \* \* \* \*